United States Patent
Song et al.

(10) Patent No.: US 11,901,376 B2
(45) Date of Patent: Feb. 13, 2024

(54) DISPLAY PANEL, MANUFACTURING METHOD THEREOF AND DISPLAYING DEVICE

(71) Applicant: BOE Technology Group Co., Ltd., Beijing (CN)

(72) Inventors: Zunqing Song, Beijing (CN); Hao Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 90 days.

(21) Appl. No.: 17/508,895

(22) Filed: Oct. 22, 2021

(65) Prior Publication Data

US 2022/0285407 A1 Sep. 8, 2022

(30) Foreign Application Priority Data

Mar. 4, 2021 (CN) .......................... 202110239432.8

(51) Int. Cl.
*H01L 27/12* (2006.01)
*G06V 40/13* (2022.01)

(52) U.S. Cl.
CPC ...... *H01L 27/1255* (2013.01); *G06V 40/1306* (2022.01); *H01L 27/1248* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 2002/0191122 A1 | 12/2002 | Tanaka et al. | |
| 2017/0344148 A1 | 11/2017 | Han et al. | |
| 2019/0005295 A1 | 1/2019 | Jia et al. | |
| 2021/0158004 A1* | 5/2021 | Lian | H10K 50/822 |

FOREIGN PATENT DOCUMENTS

| | | |
|---|---|---|
| CN | 105977314 A | 9/2016 |
| CN | 106611170 A | 5/2017 |
| CN | 109299630 A | 2/2019 |
| CN | 110010061 A | 7/2019 |

OTHER PUBLICATIONS

CN202110239432.8 first office action.
CN202110239432.8 second office action and search report.

* cited by examiner

*Primary Examiner* — Bo B Jang
(74) *Attorney, Agent, or Firm* — IPro, PLLC

(57) ABSTRACT

The disclosure provides a display panel, a manufacturing method thereof and a displaying device. The display panel comprises a plurality of display units, and each display unit has an active area for display and an induction area for identifying fingerprints. The display unit comprises a substrate, a planarization layer, a pixel unit and an induction electrode, wherein the planarization layer is arranged on the substrate and comprises a first area and a second area, the first area is opposite to the active area, and the second area is opposite to the induction area and is provided with a concave-convex structure; the pixel unit is arranged on the planarization layer and located in the first area; and the induction electrode is arranged on the planarization layer and covers a concave-convex surface of the concave-convex structure.

18 Claims, 6 Drawing Sheets

DISPLAY PANEL, MANUFACTURING METHOD THEREOF AND DISPLAYING DEVICE

CROSS REFERENCE OF RELATED APPLICATIONS

The application claims priority to Chinese Patent Application No. 202110239432.8, entitled "DISPLAY PANEL, MANUFACTURING METHOD THEREOF AND DISPLAYING DEVICE", filed with the China National Intellectual Property Administration on Mar. 4, 2021, which is incorporated herein by reference in its entirety.

TECHNICAL FIELD

The disclosure relates to the technical field of display, in particular to a display panel, a manufacturing method thereof and a displaying device.

BACKGROUND

The flexible organic light emitting display (OLED) technology has gradually occupied the market for its advantages of low power consumption, wide color gamut, lightness and abnormity, and has been widely used in the technical fields of portable electronics, wearable devices, instant messaging, virtual reality and so on.

The combination of the OLED technology and the personal identity verification technology (such as fingerprint induction) is the development trend, which will make electronic products lighter and thinner. With the development of the IOT (Internet of Everything) concept, the personal identity verification technology and the display technology are simultaneously applied to more and more scenarios.

SUMMARY

The disclosure provides a display panel, a manufacturing method thereof and a displaying device.

A display panel according to an embodiment of a first aspect of the disclosure comprises a plurality of display units, and each of the plurality of the display units has an active area for display and an induction area for identifying fingerprints. The display unit comprises: a substrate; a planarization layer arranged on the substrate and comprising a first area and a second area, wherein the first area is opposite to the active area, and the second area is opposite to the induction area and is provided with a concave-convex structure; a pixel unit arranged on the planarization layer and located in the first area; and an induction electrode arranged on the planarization layer and covering a concave-convex surface of the concave-convex structure.

According to some embodiments of the disclosure, the concave-convex structure is a plurality of convex structures or a plurality of concave structures formed on the planarization layer.

According to some embodiments of the disclosure, a cross section of the convex structure or the concave structure is polygonal, homocentric square-shaped, circular or elliptical.

According to some embodiments of the disclosure, an outer contour of an orthographic projection of the induction electrode on the substrate is square.

According to some embodiments of the disclosure, the induction electrode is provided with a lap hole, and the lap hole is arranged in a middle of the induction electrode.

According to some embodiments of the disclosure, the induction electrode is provided with a lap hole, and the lap hole is arranged in an edge of the induction electrode.

According to some embodiments of the disclosure, the display unit further comprises a first thin film transistor located in the active area and a second thin film transistor located in the induction are; the first thin film transistor is electrically connected with the pixel unit, and is configured for driving the pixel unit; and the second thin film transistor is electrically connected with the induction electrode, and is configured for driving the induction electrode.

A manufacturing method of the display panel according to an embodiment of a second aspect of the disclosure comprises the following steps: providing a substrate; forming a planarization layer on the substrate, wherein the planarization layer comprises a first area and a second area, the first area is opposite to the active area, and the second area is opposite to the induction area and is provided with a concave-convex structure; and forming an induction electrode on a surface of the concave-convex structure.

According to some embodiments of the disclosure, the method for forming the planarization layer comprises: forming, by using a mask with different transmittances, the planarization layer with the concave-convex structure on the substrate.

According to some embodiments of the disclosure, the method for forming the planarization layer further comprises: forming, by a one halftone mask with two transmittances or a gray scale mask with three or more transmittances, the planarization layer on the substrate.

According to some embodiments of the disclosure, the step of forming the planarization layer on the substrate comprises: forming a first planarization layer on the substrate through a first mask with a single transmittance; and forming a second planarization layer with the concave-convex structure on the first planarization layer through a second mask with a single transmittance.

A displaying device according to an embodiment of a third aspect of the disclosure comprises the display panel according to the above embodiments of the disclosure.

Additional aspects and advantages of the disclosure will be set forth in part in the description that follows, and in part will be obvious from the description that follows, or may be learned by practice of the disclosure.

BRIEF DESCRIPTION OF THE DRAWINGS

In order to explain the technical solution in the embodiments of the disclosure or the prior art more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

DETAILED DESCRIPTION

Embodiments of the disclosure are described in detail below, examples of which are shown in the accompanying drawings, in which identical or similar reference signs denote identical or similar elements or elements having identical or similar functions throughout. The embodiments described below with reference to the drawings are exemplary ones for explaining the disclosure, should not be understood as limiting the disclosure.

The following provides many different embodiments or examples for implementing different structures of the disclosure. In order to simplify the disclosure of the disclosure, components and arrangements of specific examples are described below. Of course, they are only examples and are not intended to limit the disclosure. In addition, the disclosure may repeat reference signs and/or letters in different examples, and such repetition is for the sake of simplicity and clarity, and does not itself indicate the relationship between the various embodiments and/or arrangements discussed. In addition, the disclosure provides examples of various specific processes and materials, but those of ordinary skill in the art may realize the disclosure of other processes and/or the use of other materials.

Figure 1:
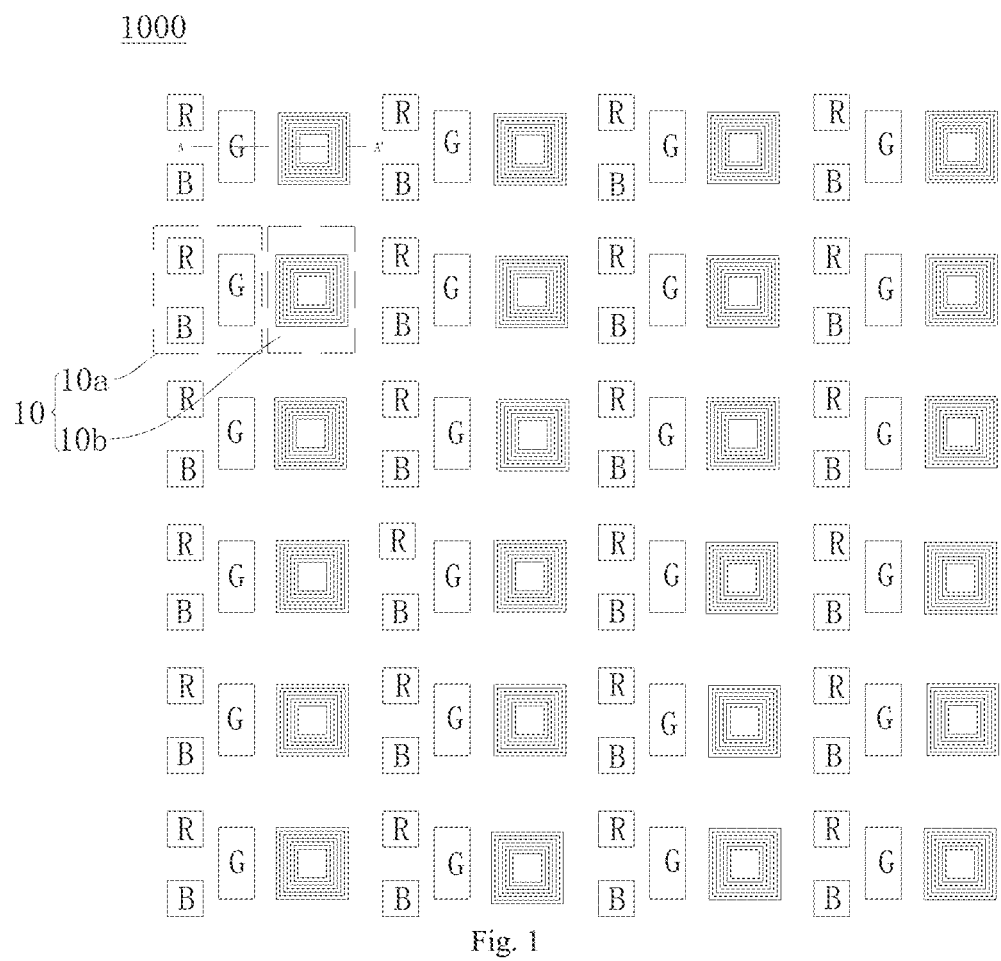
FIG. 1 is a top view of a display panel according to an embodiment of the disclosure.

A display panel 1000 according to an embodiment of a first aspect of the disclosure comprises a plurality of display units 10. Each display unit 10 has an active area 10*a* for display and an induction area 10*b* for identifying fingerprints. In the disclosure, "a plurality of" means two or more. As shown in FIG. 1, a plurality of display units 10 may be arranged into an array.

The display panel 1000 may be a display panel 1000 that integrates top emission OLED (Organic Light-Emitting Diode) displays such as LTPS (Low Temperature Poly-Silicon), α-Si, IGZO (Indium Gallium Zinc Oxide), monocrystalline silicon, and organic semiconductors with capacitive fingerprint sensors. Of course, the display panel 1000 may also be a display panel 1000 such as a bottom emission OLED device, an inorganic Mini/Micro LED, and a liquid crystal display panel.

Specifically, the display unit 10 comprises a substrate 100, a planarization layer 301, a pixel unit 20, and an induction electrode 30. The planarization layer 301 is disposed on the substrate 100 and comprises a first area and a second area, wherein the first area is opposite to the display area 10*a*, and the second area is opposite to the induction area 10*b* and is provided with a concave-convex structure 3011. The pixel unit 20 is disposed on the planarization layer 301 and located in the first area. The induction electrode 30 is disposed on the planarization layer 301 and covers a concave-convex surface of the concave-convex structure 3011. As shown in FIGS. 2-5, the induction electrode 30 extends along the concave-convex surface of the concave-convex structure 3011.

The pixel unit 20 is used to emit light for display. As shown in FIGS. 6-15, the pixel unit 20 comprises a plurality of sub-pixels 20*a*. The induction electrode 30 is used for forming capacitance with a user's finger when a fingerprint of the user's finger covers the display panel 1000, and outputting a signal, so as to identify the fingerprint of the user through the output signal.

With the popularity of mobile devices, identity authentication is required in more and more scenarios such as mobile device locks, mobile payment, and electronic locks. Fingerprint authentication is one of the most widely used methods for identity authentication at present. Capacitive fingerprint identification is most widely used. However, in order to realize a capacitive sensor with high pixels per inch, the problem of a capacitance decrease, namely a decrease in induction accuracy, caused by a small electrode area needs to be solved. The inventors realized that because the area occupied by the induction electrode 30 is limited and a distance between the finger and the electrode is fixed, it is necessary to design the induction electrode 30 specially to increase induction capacitance and sensitivity.

In the disclosure, the concave-convex structure 3011 is arranged on the planarization layer 301, and the induction electrode 30 is arranged on the concave-convex structure 3011, so that the induction electrode 30 covers the concave-convex surface of the concave-convex structure 3011. Therefore, the capacitance of the induction electrode 30 and the induction accuracy of the induction electrode 30 are improved without increasing the area occupied by the induction electrode 30, thereby improving the fingerprint identification accuracy and reducing the demand of the induction electrode 30 on a layout area, and further improving the PPI (pixels per inch) and aperture ratio of the active area 10*a* under the same DPI (dots per inch) and induction accuracy.

DPI refers to dots per inch of an image. DPI is a unit of measurement for dot matrix digital images, which refers to the number of sampling, displayable or output points per inch. PPI is pixels per inch. Therefore, a high PPI value means that a display screen can display images with high density. The aperture ratio refers to a ratio of the area of a light passing part after removing a wiring part and a transistor part of each sub-pixel (usually hidden by a black matrix) to the whole area of each sub-pixel, that is, a ratio of an effective light transmission area to the whole area. The higher the aperture ratio, the higher the light transmission efficiency.

According to the display panel 1000 of the embodiment of the disclosure, the concave-convex structure 3011 is arranged on the planarization layer 301, and the induction electrode 30 is arranged on the concave-convex structure 3011, so that the induction electrode 30 covers the concave-convex surface of the concave-convex structure 3011. Therefore, the capacitance of the induction electrode 30 and the induction accuracy of the induction electrode 30 are improved without increasing the area occupied by the induction electrode 30, thereby improving the fingerprint identification accuracy and reducing the demand of the induction electrode 30 on a layout area, and further improving the PPI and aperture ratio of the active area 10*a* under the same DPI and induction accuracy.

As shown in FIGS. 2-5, in some embodiments of the disclosure, the display unit 10 further comprises a first thin film transistor 202a located in the active area 10a and a second thin film transistor 202b located in the induction area 10b. The first thin film transistor 202a is electrically connected with the pixel unit 20, and is used for driving the pixel unit 20 in the active area 10a. The second thin film transistor 202b is electrically connected with the induction electrode 30, and serves as an induction circuit of the induction area 10b for driving the induction electrode 30 to start self-capacitance fingerprint identification.

In addition, the induction circuit also comprises a fingerprint identification scanning line and a fingerprint identification induction line. In a fingerprint identification mode, the fingerprint identification scanning line scans line by line according to a time sequence signal to input scanning signals, and the fingerprint identification induction line receives the signals in turn to perform fingerprint identification.

According to some embodiments of the disclosure, the concave-convex structure 3011 comprises a plurality of convex structures or a plurality of concave structures formed on the planarization layer 301.

Figure 2:
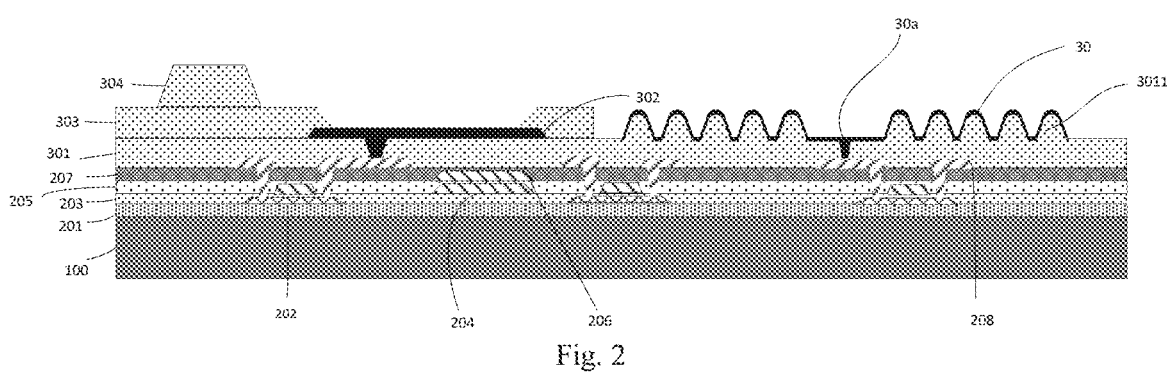
FIG. 2 is a sectional view taken along line A-A in FIG. 1.
Figure 3:
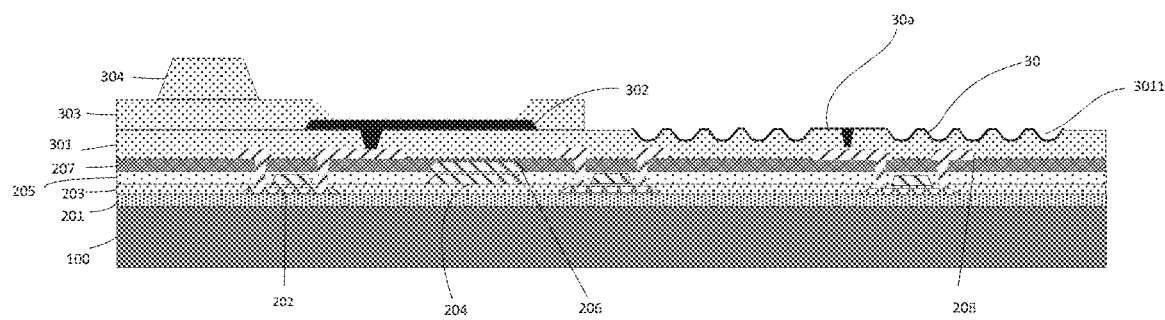
FIG. 3 is a sectional view of a display unit according to another embodiment of the disclosure.
Figure 4:
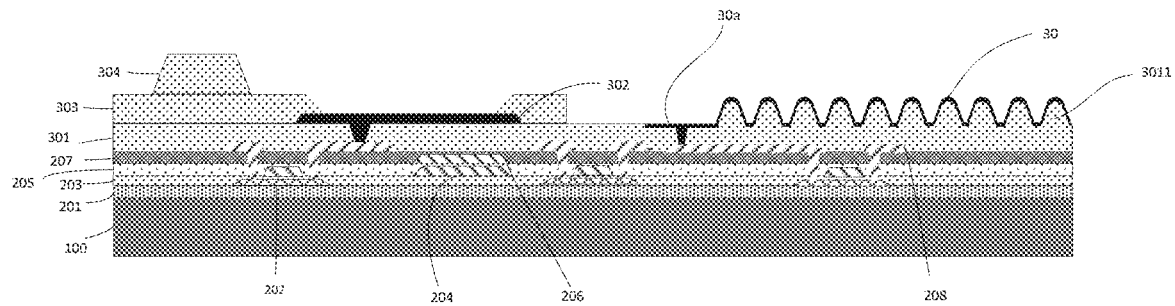
FIG. 4 is a sectional view of a display unit according to yet another embodiment of the disclosure.
Figure 5:
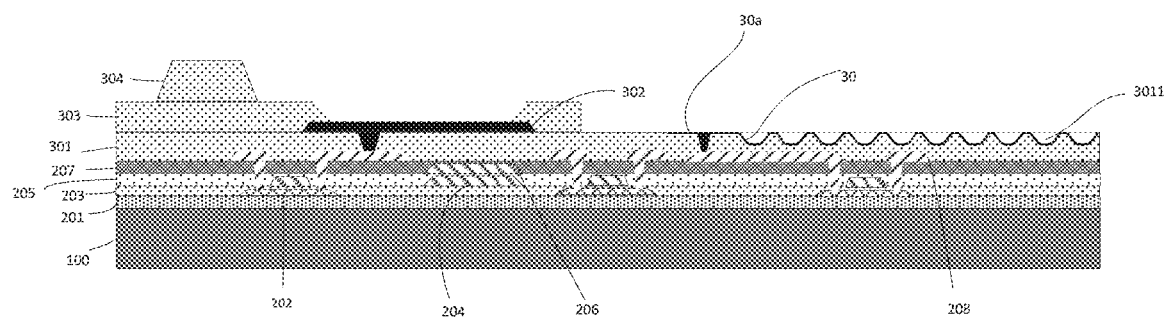
FIG. 5 is a sectional view of a display unit according to yet another embodiment of the disclosure.
Figure 6:
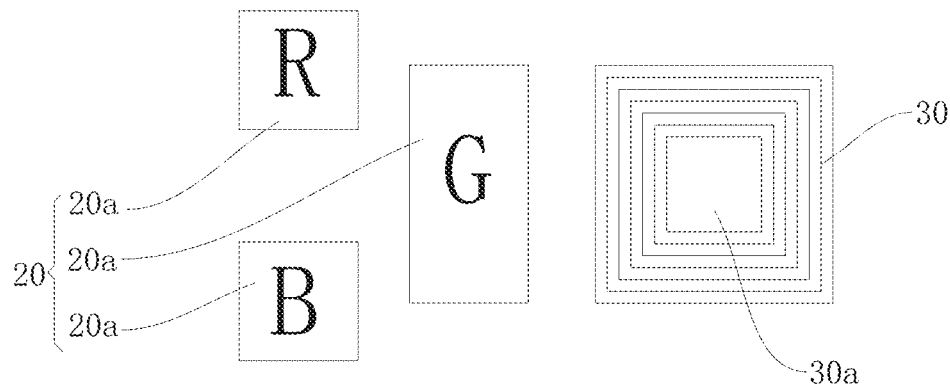
FIG. 6 is a top view of a display unit according to an embodiment of the disclosure.
Figure 7:
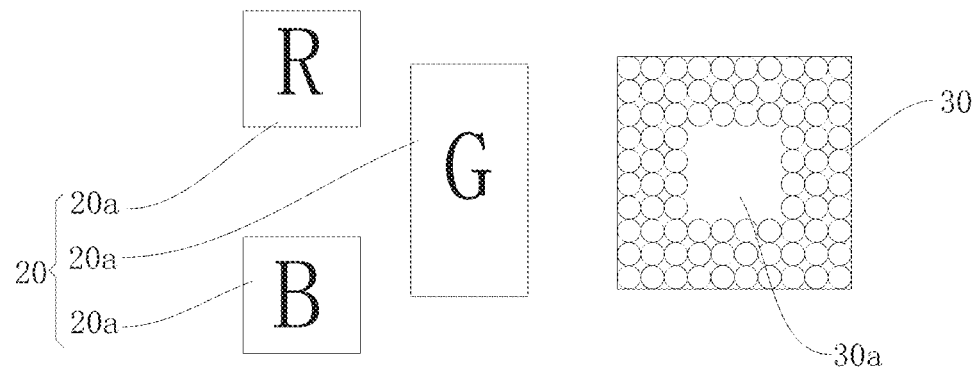
FIG. 7 is a top view of a display unit according to another embodiment of the disclosure.
Figure 8:
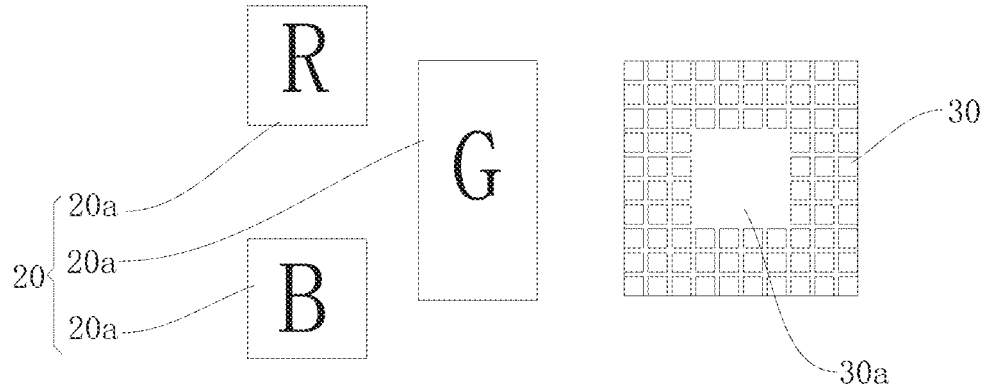
FIG. 8 is a top view of a display unit according to yet another embodiment of the disclosure.
Figure 9:
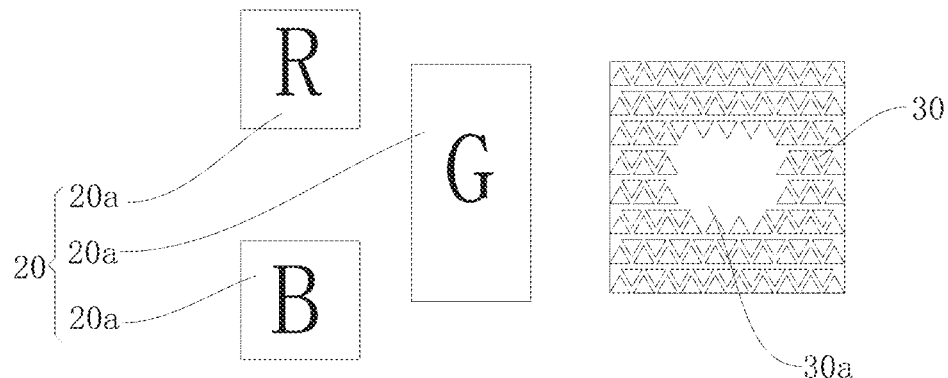
FIG. 9 is a top view of a display unit according to yet another embodiment of the disclosure.
Figure 10:
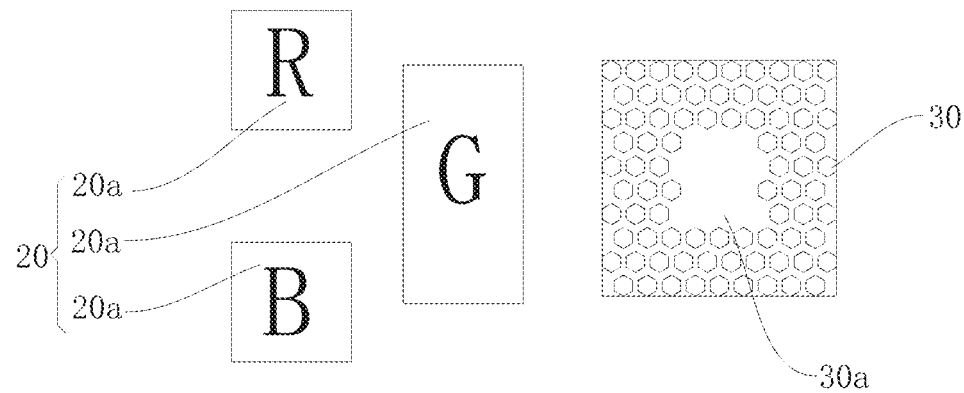
FIG. 10 is a top view of a display unit according to yet another embodiment of the disclosure.
Figure 11:
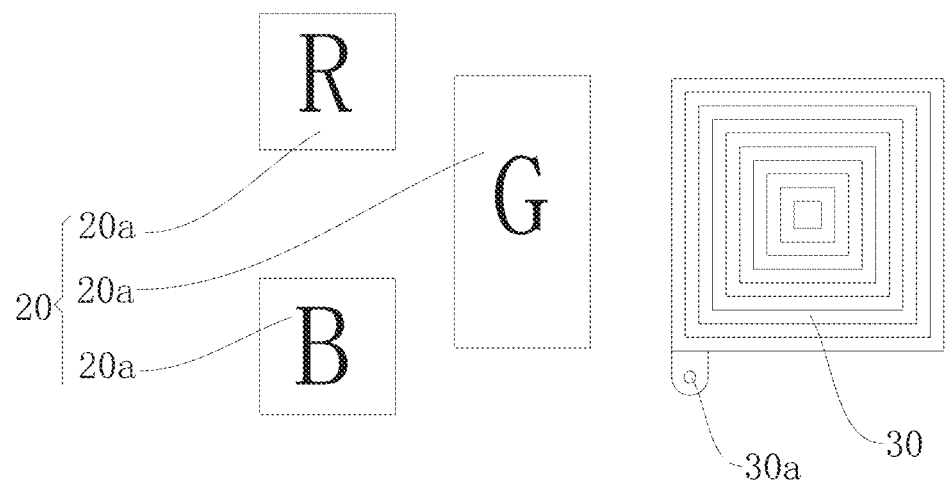
FIG. 11 is a top view of a display unit according to yet another embodiment of the disclosure.
Figure 12:
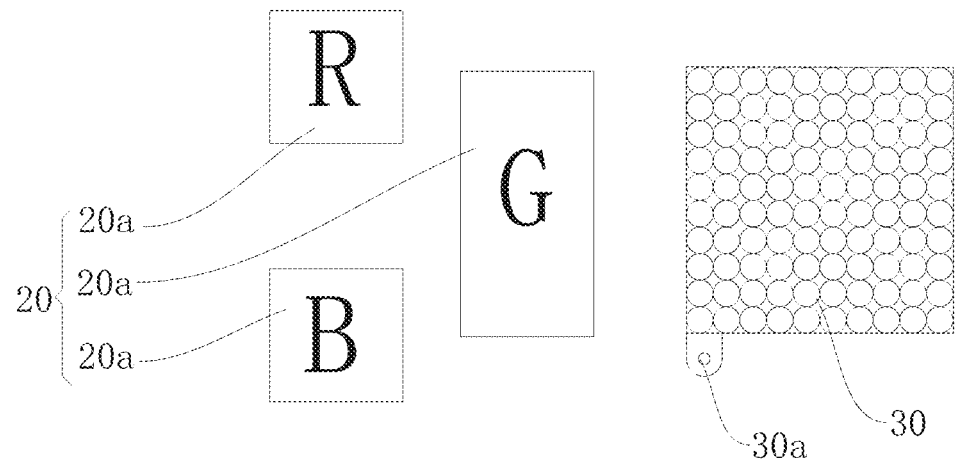
FIG. 12 is a top view of a display unit according to yet another embodiment of the disclosure.
Figure 13:
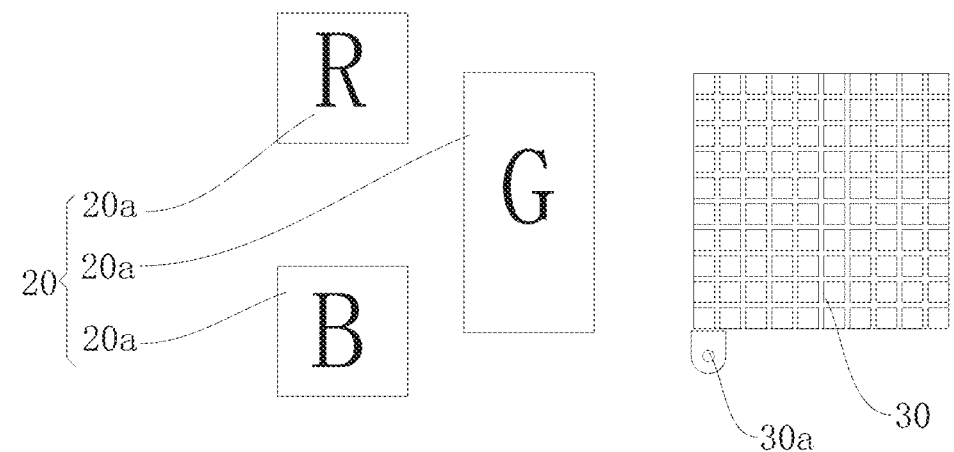
FIG. 13 is a top view of a display unit according to yet another embodiment of the disclosure.
Figure 14:
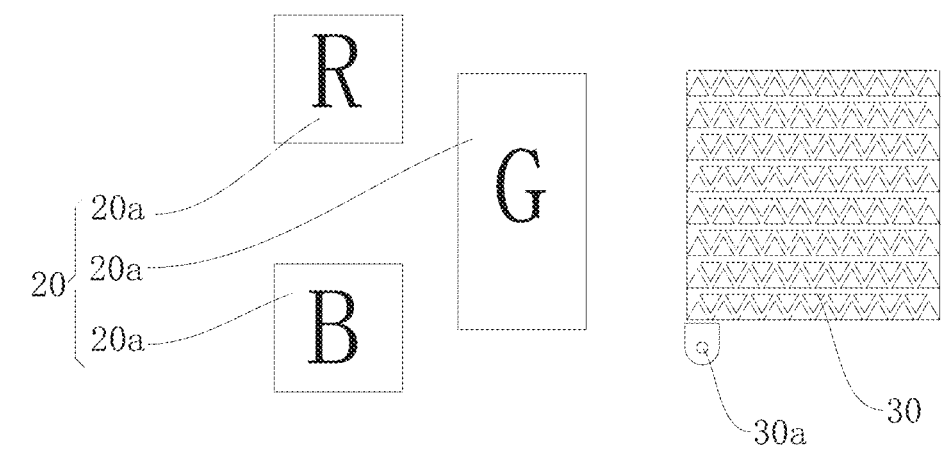
FIG. 14 is a top view of a display unit according to yet another embodiment of the disclosure.
Figure 15:
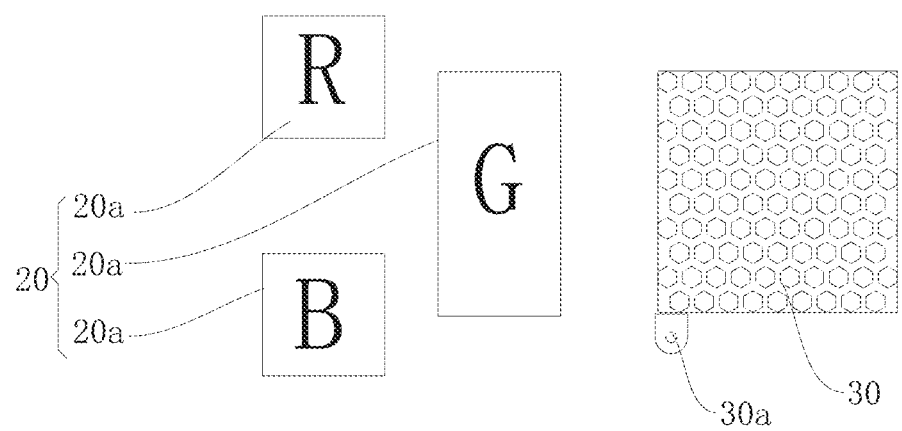
FIG. 15 is a top view of a display unit according to yet another embodiment of the disclosure.

As shown in FIGS. 2 and 4, the concave-convex structure 3011 comprises a plurality of convex structures formed on the planarization layer 301, and in this case, the convex structures protrude from a side surface, away from the substrate 100, of the planarization layer 301. The plurality of convex structures may be arranged at intervals or connected in sequence. That is, the plurality of convex structures may be densely arranged or not densely arranged on the planarization layer 301. As shown in FIGS. 3 and 5, the concave-convex structure 3011 comprises a plurality of concave structures formed on the planarization layer 301, and in this case, the concave structures are recessed toward the substrate 100 from a side surface, away from the substrate 100, of the planarization layer 301. The plurality of concave structures may be arranged at intervals or connected in sequence. That is, the plurality of convex structures may be densely arranged or not densely arranged on the planarization layer 301.

Therefore, the area occupied by the induction electrode 30 can be effectively reduced, and the capacitance of the induction electrode 30 can be improved, thereby improving the induction accuracy of the induction electrode 30. Further, the display panel features a simple structure and ingenious design, and is easy to manufacture.

In the manufacturing process, the planarization layer 301 may be formed on the substrate 100 by a mask with different transmittances. For example, the planarization layer 301 may be formed on the substrate 100 by a one halftone mask with two transmittances or a gray scale mask with three or more transmittances, so that the concave-convex structure 3011 may be conveniently formed on the second area of the planarization layer 301.

According to some embodiments of the disclosure, a cross section of the convex structure or the concave structure is polygonal, homocentric square-shaped, circular or elliptical. It should be noted that the cross section of the convex structure or the concave structure described in the disclosure refers to a cross section obtained by cutting the concave-convex structure 3011 with a surface parallel to the substrate 100. FIGS. 6-10 show cross-sectional shapes of the concave-convex structure having different cross-sections. Therefore, the capacitance of the induction electrode 30 can be increased, the structure is simple, and manufacturing is easy.

According to some embodiments of the disclosure, an outer contour of an orthographic projection of the induction electrode 30 on the substrate 100 is square. As shown in FIGS. 6-15, the induction electrode 30 is a square as a whole, which is simple structure and easy to manufacture. It can be understood that the overall shape of the induction electrode 30 is not limited to square, and its specific shape may be adjusted and designed according to the specific structure of the display panel 1000, with the maximum area occupied by the induction electrode 30 being preferred.

According to some embodiments of the disclosure, the induction electrode 30 is provided with a lap hole 30a, and the lap hole 30a is arranged in the middle of the induction electrode 30. It can be understood that "the middle of the induction electrode 30" mentioned in the disclosure should be broadly understood, that is, any part inside the outer contour of the induction electrode 30 can be understood as the middle of the induction electrode 30. As shown in FIGS. 6-10, the lap hole 30a is formed in the middle of the induction electrode 30. In other embodiments of the disclosure, as shown in FIGS. 11-15, the lap hole 30a may also be arranged in an edge of the induction electrode 30. The induction electrode 30 may be electrically connected with the induction circuit through the lap hole 30a. Therefore, the electrical connection between the induction electrode 30 and the induction circuit can be easily realized, the structure is simple, and manufacturing is easy.

Other components and operations of the display panel 1000 according to embodiments of the disclosure are known to those of ordinary skill in the art, and will not be described in detail here.

A manufacturing method of the display panel 1000 according to an embodiment of a second aspect of the disclosure comprises the following steps:

providing a substrate 100, wherein the substrate 100 may be a polyimide substrate 100 or a glass substrate 100;

forming a planarization layer 301 on the substrate 100, wherein the planarization layer 301 comprises a first area and a second area, the first area is opposite to the display area 10a, and the second area is opposite to the induction area 10b and is provided with a concave-convex structure 3011; and forming an induction electrode 30 on a surface of the concave-convex structure 3011.

According to the manufacturing method of the display panel 1000 of the embodiment of the disclosure, the concave-convex structure 3011 is arranged on the planarization layer 301, and the induction electrode 30 is arranged on the concave-convex structure 3011, so that the induction electrode 30 covers the concave-convex surface of the concave-convex structure 3011. Therefore, the capacitance of the induction electrode 30 and the induction accuracy of the induction electrode 30 are improved without increasing the area occupied by the induction electrode 30, thereby improving the fingerprint identification accuracy and reducing the demand of the induction electrode 30 on a layout area, and further improving the PPI and aperture ratio of the active area 10a under the same DPI and induction accuracy.

According to some embodiments of the disclosure, the planarization layer 301 is formed in such a way that a mask with different transmittances is used to form the planarization layer 301 with the concave-convex structure 3011 on the substrate 100. For example, the planarization layer 301 may be formed on the substrate 100 by a halftone mask with two transmittances, or a grayscale mask with three or more transmittances. In the manufacturing process, the concave-convex structure 3011 can be formed on the second area of the planarization layer 301 simply by making a plurality of protrusions or grooves in an electrode area, so that the concave-convex structure 3011 can be conveniently formed on the second area of the planarization layer 301 by one mask.

According to some embodiments of the disclosure, the step of forming the planarization layer 301 includes:

forming a first planarization layer on the substrate 100 through a first mask with a single transmittance; and forming a second planarization layer with the concave-convex structure 3011 on the first planarization layer through a second mask with a single transmittance.

Therefore, by forming two planarization layers 301 on the substrate 100, the concave-convex structure 3011 can also be easily formed on the planarization layers 301.

Other manufacturing procedures of the display panel 1000 of the embodiment of the disclosure, for example, forming a buffer layer 201, a first gate insulating layer 203 (GI1), a first gate 204 (gate1), a second gate insulating layer 205 (GI2), a second gate 206 (gate2), an intermediate insulating layer 207 (ILD), source-drain metal 208 (SD), an anode 302 (AND), a pixel defining layer 303 (PDL) or a photo spacer 304 on the substrate 100, are well known to those skilled in the art and will not be described in detail here.

A displaying device according to an embodiment of a third aspect of the disclosure comprises the display panel 1000 according to the above embodiment of the disclosure.

According to the displaying device of the embodiment of the third aspect of the disclosure, the display panel 1000 according to the above embodiment of the disclosure is provided, the concave-convex structure 3011 is arranged on the planarization layer 301, and the induction electrode 30 is arranged on the concave-convex structure 3011, so that the induction electrode 30 covers the concave-convex surface of the concave-convex structure 3011. Therefore, the capacitance of the induction electrode 30 and the induction accuracy of the induction electrode 30 are improved without increasing the area occupied by the induction electrode 30, thereby improving the fingerprint identification accuracy and reducing the demand of the induction electrode 30 on a layout area, and further improving the PPI and aperture ratio of the active area 10a under the same DPI and induction accuracy.

In the description of the disclosure, it should be noted that the orientation or position relationship indicated by the terms "inner", "outer" and the like are based on the orientation or position relationship shown in the drawings, only for convenience of describing the disclosure and simplifying the description, and do not indicate or imply that the device or element referred to must have a specific orientation, or be constructed and operated in a specific orientation, and therefore cannot be understood as a limitation of the disclosure.

The terms "first" and "second" are only used for descriptive purposes, and cannot be understood as indicating or implying relative importance or implicitly indicating the number of indicated technical features. Therefore, the features defined with "first" and "second" may include one or more of the features explicitly or implicitly. In the description of the disclosure, unless otherwise specified, the meaning of "a plurality of" is two or more.

In this disclosure, unless otherwise specified and limited, a first feature is "above" or "below" a second feature may mean that the first feature and the second feature are in direct contact, or the first feature and the second feature are in indirect contact through an intermediary. Furthermore, the first feature is "above" the second feature may be that the first feature is directly above or obliquely above the second feature, or it only means that a level of the first feature is higher than that of the second feature; and the first feature is "below" the second feature may be that the first feature is directly below or obliquely below the second feature, or it only means that the level of the first feature is lower than that of the second feature.

In this specification, descriptions referring to the terms "one embodiment", "some embodiments", "example", "specific example", or "some examples" mean that specific features, structures, materials or characteristics described in connection with this embodiment or example are included in at least one embodiment or example of this disclosure. In this specification, the schematic expressions of the above terms do not necessarily refer to the same embodiments or examples. Furthermore, the specific features, structures, materials or characteristics described may be combined in any one or more embodiments or examples in a suitable manner. In addition, those skilled in the art may combine different embodiments or examples and features of different embodiments or examples described in this specification without contradicting each other.

Although the embodiments of the disclosure have been shown and described, it will be understood by those of ordinary skill in the art that various changes, modifications, substitutions and variations can be made to these embodiments without departing from the principles and spirit of the disclosure, the scope of which is defined by the claims and their equivalents.

The invention claimed is:

1. A display panel, comprising a plurality of display units, each of the display units having an active area for display and an induction area for identifying fingerprints, wherein the display unit comprises:

a substrate;

a planarization layer arranged on the substrate and comprising a first area and a second area, wherein the first area is opposite to the active area, and the second area is opposite to the induction area and is provided with a concave-convex structure;

a pixel unit arranged on the planarization layer and located in the first area; and an induction electrode arranged on the planarization layer and covering a concave-convex surface of the concave-convex structure to extend along the concave-convex surface of the concave-convex structure, so as to improve capacitance with a finger of user in response that a fingerprint of the finger of the user covers the display panel, and output a signal so as to identify the fingerprint of the user through the output signal.

2. The display panel according to claim 1, wherein the concave-convex structure is a plurality of convex structures or a plurality of concave structures formed on the planarization layer.

3. The display panel according to claim 2, wherein a cross section of each convex structure or each concave structure is polygonal, homocentric square-shaped, circular or elliptical.

4. The display panel according to claim 1, wherein an outer contour of an orthographic projection of the induction electrode on the substrate is square.

5. The display panel according to claim 1, wherein the induction electrode is provided with a lap hole, and the lap hole is arranged in a middle of the induction electrode.

6. The display panel according to claim 1, wherein the induction electrode is provided with a lap hole, and the lap hole is arranged in an edge of the induction electrode.

7. The display panel according to claim 1, wherein the display unit further comprises a first thin film transistor located in the active area and a second thin film transistor located in the induction area;
- the first thin film transistor is electrically connected with the pixel unit, and is configured for driving the pixel unit; and
- the second thin film transistor is electrically connected with the induction electrode, and is configured for driving the induction electrode.

8. A manufacturing method of the display panel according to claim 1, comprising the following steps:
providing the substrate;
forming the planarization layer on the substrate, wherein the planarization layer comprises the first area and the second area, the first area is opposite to the active area, the second area is opposite to the induction area, and the second area is provided with the concave-convex structure; and
forming the induction electrode on the concave-convex surface of the concave-convex structure.

9. The manufacturing method of the display panel according to claim 8, wherein the method for forming the planarization layer comprises: forming, by using a mask with different transmittances, the planarization layer with the concave-convex structure on the substrate.

10. The manufacturing method of the display panel according to claim 8, wherein the method for forming the planarization layer further comprises: forming, by a one halftone mask with two transmittances or a gray scale mask with three or more transmittances, the planarization layer on the substrate.

11. The manufacturing method of the display panel according to claim 8, wherein the step of forming the planarization layer on the substrate comprises:
forming a first planarization layer on the substrate; and
forming a second planarization layer with the concave-convex structure on the first planarization layer.

12. A displaying device, comprising the display panel according to claim 1.

13. The displaying device according to claim 12, wherein the concave-convex structure is a plurality of convex structures or a plurality of concave structures formed on the planarization layer.

14. The displaying device according to claim 13, wherein a cross section of each convex structure or each concave structure is polygonal, homocentric square-shaped, circular or elliptical.

15. The displaying device according to claim 12, wherein an outer contour of an orthographic projection of the induction electrode on the substrate is square.

16. The displaying device according to claim 12, wherein the induction electrode is provided with a lap hole, and the lap hole is arranged in a middle of the induction electrode.

17. The displaying device according to claim 12, wherein the induction electrode is provided with a lap hole, and the lap hole is arranged in an edge of the induction electrode.

18. The displaying device according to claim 12, wherein the display unit further comprises a first thin film transistor located in the active area and a second thin film transistor located in the induction area;
- the first thin film transistor is electrically connected with the pixel unit, and is configured for driving the pixel unit; and
- the second thin film transistor is electrically connected with the induction electrode, and is configured for driving the induction electrode.

\* \* \* \* \*